(12) United States Patent
Mori et al.

(10) Patent No.: US 6,673,262 B1
(45) Date of Patent: Jan. 6, 2004

(54) GAS FOR REMOVING DEPOSIT AND REMOVAL METHOD USING SAME

(75) Inventors: Isamu Mori, Saitama (JP); Tetsuya Tamura, Saitama (JP); Mitsuya Ohashi, Saitama (JP)

(73) Assignee: Central Glass Company, Limited, Ube (JP)

( * ) Notice: Subject to any disclaimer, the term of this patent is extended or adjusted under 35 U.S.C. 154(b) by 0 days.

(21) Appl. No.: 09/208,022

(22) Filed: Dec. 9, 1998

(30) Foreign Application Priority Data

Dec. 18, 1997 (JP) .............................. 9-349536
Aug. 26, 1998 (JP) ........................... 10-239338
Aug. 26, 1998 (JP) ........................... 10-239339

(51) Int. Cl.$^7$ .............................................. C09K 13/08
(52) U.S. Cl. .......................... 252/79.3; 252/79.1; 134/2
(58) Field of Search .............................. 134/37, 1, 1.3, 134/1.1, 1.2, 2; 252/79.3, 79.1

(56) References Cited

U.S. PATENT DOCUMENTS

| | | | |
|---|---|---|---|
| 3,415,865 A | * 12/1968 | Prager et al. | |
| 3,917,688 A | 11/1975 | Bartoon et al. | |
| 5,176,790 A | 1/1993 | Arleo et al. | |
| 5,356,478 A | * 10/1994 | Chen et al. | ..................... 134/1 |
| 5,817,578 A | * 10/1998 | Ogawa | ..................... 134/1.1 X |
| 5,824,604 A | * 10/1998 | Bar-Gada | ..................... 438/725 |

FOREIGN PATENT DOCUMENTS

| | | |
|---|---|---|
| EP | 227839 | 7/1987 |
| EP | 343038 | 11/1989 |
| EP | 348980 | 1/1990 |
| JP | 8-291299 | * 11/1996 |

OTHER PUBLICATIONS

Patent Abstracts of Japan, abstract of JP 07–169756 published Jul. 4, 1995.
Patent Abstracts of Japan, abstract of JP 57–049234 published Mar. 23, 1982.
Patent Abstracts of Japan, abstract of JP 08–291299 published Nov. 5, 1996.

* cited by examiner

Primary Examiner—Alexander Markoff
(74) Attorney, Agent, or Firm—Crowell & Moring LLP

(57) ABSTRACT

The invention relates to a gas for removing deposits by a gas-solid reaction. This gas includes a hypofluorite that is defined as being a compound having at least one OF group in the molecule. Various deposits can be removed by the gas, and the gas can easily be made unharmful on the global environment after the removal of the deposits, due to the use of a hypofluorite. The gas may be a cleaning gas for cleaning, for example, the inside of an apparatus for producing semiconductor devices. This cleaning gas comprises 1–100 volume % of the hypofluorite. Alternatively, the gas of the invention may be an etching gas for removing an unwanted portion of a film deposited on a substrate. The unwanted portion can be removed by this etching gas as precisely as originally designed, due to the use of a hypofluorite. The invention further relates to a method for removing a deposit by the gas. This method includes the step (a) bringing the gas into contact with the deposit, thereby to remove the deposit by a gas-solid reaction.

15 Claims, 1 Drawing Sheet

… … …

GAS FOR REMOVING DEPOSIT AND REMOVAL METHOD USING SAME

BACKGROUND OF THE INVENTION

The present invention relates to a gas, that is, a cleaning or etching gas, for removing deposits by a gas-solid reaction and a removal method using the gas.

In thin-film device production process of semiconductor industry, optical device production process, super steel material production process and the like, various thin films, thick films, powders, whiskers and the like are produced, for example, by chemical vapor deposition, (CVD), physical vapor deposition (PVD), sputtering, and sol-gel process. During the production of these materials, unnecessary deposits in the form of film, whisker or powder are inevitably formed, for example, on a reactor's inner wall and a jig for supporting the object, as well as on the object. This may cause the occurrence of unnecessary particles, making it difficult to produce films, powders, whiskers and the like of good quality. Thus, it becomes necessary to occasionally remove the unnecessary deposits, for example, by cleaning gas. Such a cleaning gas is required, for example, to have (1) a high reaction rate at which the cleaning gas reacts with unnecessary deposits to form volatile compounds, (2) a relative easiness to make the exhaust gas of the cleaning unharmful, and (3) a relative unstableness in the atmosphere to make the impact on the global warming smaller. Conventional examples of the cleaning gas are $C_2F_6$, $CF_4$, $C_4F_8$, $NF_3$ and $ClF_3$. These compounds, however, have the following defects. Firstly, $ClF_3$ is highly reactive, and thus may do damage to materials conventionally used for the apparatus, when $ClF_3$ is used at a high temperature or with the assistance of plasma. Secondly, $NF_3$ is low in reactivity unless the reaction temperature is at least 300° C., and thus may be impossible to remove unnecessary deposits accumulated in the piping of the apparatus and the outside of the plasma region. Furthermore, it is necessary to have a high temperature in order to make the exhaust gas unharmful. Thus, the cost for conducting the cleaning becomes relatively high. Thirdly, each of $C_2F_6$, $CF_4$ and $C_4F_8$ has the following defects. That is, it may be impossible to remove unnecessary deposits accumulated in the piping of the apparatus and the outside of the plasma region. Furthermore, a fluorocarbon(s) will accumulate by the plasma cleaning. If oxygen is added in order to decrease the amount of the accumulation of the fluorocarbon(s), an oxide(s) will accumulate instead. Since each of $C_2F_6$, $CF_4$ and $C_4F_8$ is a very stable compound, it is difficult to treat the exhaust gas of the cleaning. In other words, these compounds (gases) will be stably present in the environment, and cause adverse impact against the environment due to their high global warming coefficients or factors. Thus, it is necessary to have a high temperature for the treatment of the exhaust gas. This makes the cost of the treatment relatively high.

An etching gas, which is analogous to the above-mentioned cleaning gas, is used for partially removing a thin film material in order to transfer the circuit pattern, for example, of LSI and TFT. Conventional examples of this etching gas are $CF_4$, $C_2F_6$, $CHF_3$, $SF_6$, and $NF_3$. These gases have a problem of high global warming coefficient. Furthermore, these gases are relatively stable gases. Thus, it is necessary to use a large amount of energy for generating, for example, $CF_3$ radicals and F radicals, which are useful as etchant. That is, the electric power consumption becomes large. Furthermore, it is relatively difficult to treat the unreacted etching gases, prior to the discharge into the atmosphere. Therefore, there is an urgent demand for an alternative etching gas(es) that can easily be made unharmful on the global environment and is capable of achieving high precision etching.

SUMMARY OF THE INVENTION

It is therefore an object of the present invention to provide a gas for removing deposits, which gas can easily be made unharmful on the global environment after the removal of deposits.

It is a more specific object of the present invention to provide a cleaning gas for efficiently removing unnecessary deposits accumulated, for example, in an apparatus for producing semiconductor devices, which cleaning gas can easily be made unharmful on the global environment after the removal of the deposits.

It is another specific object of the present invention to provide an etching gas for removing, as precisely as originally designed, an unwanted portion of a film deposited on a substrate, for example, for producing thin film devices (e.g., LSI and TFT), which etching gas can easily be made unharmful on the global environment after the removal of the unwanted portion.

It is a still another object of the present invention to provide a method for removing a deposit by the gas.

According to the present invention, there is provided a gas for removing deposits by a gas-solid reaction. This gas comprises a hypofluorite that is defined as being a compound having at least one OF group in the molecule. We unexpectedly found that various deposits can be removed by the gas and that the gas can easily be made unharmful on the global environment after the removal of the deposits. The gas may be a cleaning gas for substantially completely removing the deposits. In other words, this cleaning gas is used for cleaning, for example, the inside of an apparatus for producing semiconductor devices. This cleaning gas comprises 1–100 volume % of the hypofluorite. We unexpectedly found that various unnecessary deposits can efficiently be removed by the cleaning gas. Furthermore, either of plasma-assisted and plasma-less cleanings is made possible by the cleaning gas. Alternatively, the gas according to the present invention may be an etching gas for removing an unwanted portion of a film deposited on a substrate. In other words, the etching gas is used, for example, in pattern transfer operations in the production of semiconductor circuits. We unexpectedly found that the unwanted portion can be removed by the etching gas as precisely as originally designed.

According to the present invention, there is provided a method for removing a deposit by the gas. This method comprises the step (a) bringing the gas into contact with the deposit, thereby to remove the deposit by a gas-solid reaction. The above-mentioned unexpected findings are also obtained by this method.

DESCRIPTION OF THE PREFERRED EMBODIMENTS

Figure 1:
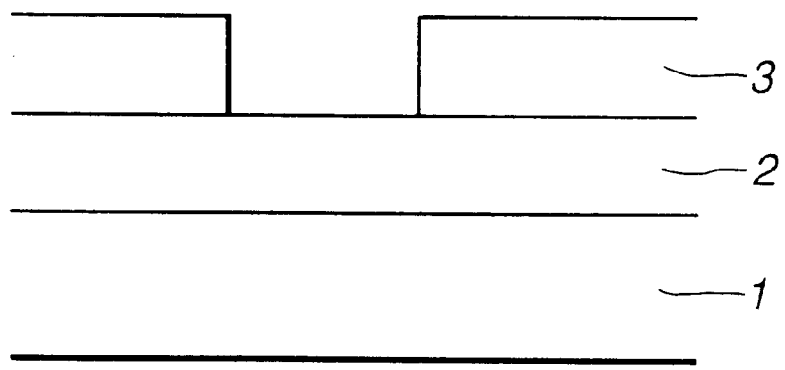
FIG. 1 is a sectional view showing a multilayer structure used in the after-mentioned Examples 1–3 and Comparative Example 1, which is prior to an etching of a $SiO_2$ insulator film with an etching gas.

A hypofluorite according to the present invention dissociates more easily than, for example, each of $CF_4$, $C_2F_6$, $C_4F_8$, and $NF_3$, and is lower than $ClF_3$ in reactivity. For example, O—F bond of a hypofluorite, that is, trifluoromethyl-hypofluorite ($CF_3O$—F), has a bond dissociation energy of 43.5 kcal/mol. This value is lower than that (61 kcal/mol) of N—F bond of $NF_3$ and higher than that (37 kcal/mol) of Cl—F of $ClF_3$. In other words, $CF_3O$—F releases active fluorine more easily than $NF_3$ and is more stable than $ClF_3$. Although $CF_3O$—F does not have a high fluorination strength as that of $F_2$ or $ClF_3$, it is sufficient to make it possible to conduct a plasma-less cleaning. Furthermore, it is possible to remove deposits (contaminants) accumulated in the outside of the plasma region by using an etching gas comprising a hypofluorite (e.g., $CF_3O$—F), although it has been impossible by using conventional plasma cleaning gases (e.g., $CF_4$). It should be noted that the hypofluorite is much smaller than $ClF_3$ in corrosiveness. That is, the hypofluorite does relatively little damage to general materials used for, for example, an inner wall of the apparatus. The hypofluorite is decomposed in the air, and thus has little to do with the global warming. Furthermore, the cleaning gas or etching gas according to the invention discharged from the apparatus can easily be decomposed by water or an alkali aqueous solution, for example, of alkali scrubber. Thus, the cleaning gas or etching gas itself is not discharged into the environment, nor produces global warming gases (e.g., $C_2F_6$ and $CF_4$). Therefore, the cleaning gas or etching gas according to the present invention does not cause substantial environmental problems. The etching gas according to the invention is capable of having a higher etching rate and a higher aspect ratio than those of, for example, $CF_4$.

In the invention, examples of the deposit, which can be removed by cleaning with the cleaning gas or by etching with the etching gas, are B, P, W, Si, Ti, V, Nb, Ta, Se, Te, Mo, Re, Os, Ru, Ir, Sb, Ge, Au, Ag, As and Cr, and oxides, nitrides, carbides and alloys of these elements. The deposit, which is partially removed by etching with the etching gas, may be formed on a substrate, such as silicon wafer, metal plate, glass plate, single crystal plate, or polycrystalline plate.

In the invention, the hypofluorite optionally has at least one selected from halogen atoms, ether groups, alcohol groups, carbonyl groups, carboxyl groups, ester groups, amine groups, and amide groups. In general, hypofluorites have very great fluorination strengths. Therefore, it may not be preferable in the invention to use a hypofluorite that has a reducing group or a bond that is unstable in terms of energy level. Preferable examples of the hypofluorite of the invention are $CF_3OF$, $CF_2(OF)_2$, $CF_3CF_2OF$, $CH_3COOF$, $(CF_3)_3COF$, $CF_2HCF_2OF$, $(CF_3CF_2)(CF_3)_2COF$, $CH_3OF$, $CFH_2OF$, $CF_2HOF$, $CF_3CF_2CF_2OF$, and $(CF_3)_2CFOF$. The hypofluorite of the invention may be derived from a halogenated hydrocarbon group, ether, alcohol, carboxylic acid, ester, amine or amide. In the invention, it is optional to use a hypofluorite that has at least two OF groups in the molecule, because this hypofluorite has a reactivity analogous to another hypofluorite having only one OF group in the molecule.

In the invention, it is optional to use a hypofluorite itself as a cleaning gas. That is, this cleaning gas contains 100% of the hypofluorite. This cleaning gas is capable of completely cleaning deposits, which have been deposited on the inside of a chamber and its exhaust pipes. These deposits may be CVD by-products or unnecessary deposits made of materials that are the same as the materials of films formed on, for example, silicon wafer and glass substrates. Furthermore, the cleaning gas of the invention can be used for cleaning a multi-chamber type CVD apparatus, various batch-type CVD apparatuses, a CVD apparatus for epitaxial growth, and the like. The manner of exciting the cleaning gas is not particularly limited. For example, high frequency or microwave may be used for the excitation, depending on the type of the apparatus. It is optional to excite the cleaning gas in the inside of the reaction chamber. Alternatively, it is optional to take a remote plasma method in which the cleaning gas is excited in the outside of the reaction chamber, and then radical or ion is introduced into the reaction chamber.

In the invention, it is optional to prepare a cleaning gas by mixing a hypofluorite with an inert gas (e.g., He, $N_2$ and Ar) and/or at least one gas component selected from oxygen and oxygen-containing gases (e.g., $CO_2$, CO, NO, $NO_2$, and $N_2O$). In fact, if deposits containing no oxygen are repeatedly removed, a very small amount of an organic fluoride having a white color accumulates on a low temperature portion of the exhaust pipe(s) of the apparatus. This organic fluoride is assumed to be a polymer made from ions and radicals, such as $CF_3O^+$, $CF_3^+$ and $CF_2^+$, derived from the hypofluorite. We unexpectedly found that the formation of this organic fluoride is prevented by mixing a hypofluorite with the above-mentioned at least one gas component. Although $CO_2$ and CO of the at least one gas component each contain carbon, which is an element causing the formation of the organic fluoride, these compounds each contain oxygen in the molecules, too. Therefore, it becomes possible to make F-radicals long in lifetime. This may prevent the formation of the polymer. In particular, it is preferable that the at least one gas component is in an amount from 0.4 to 90 volume %, based on the total volume of the at least one gas component and the hypofluorite. If it is less than 0.4 volume %, carbon may remain on the wall of the reactor or the piping after the cleaning. If it is greater than 90 volume %, the oxidation of the surface of the deposit may occur predominantly. This may lower the cleaning rate too much.

In the invention, as mentioned above, the cleaning gas may be a hypofluorite itself or a mixture of a hypofluorite and the at least one gas component selected from oxygen and oxygen-containing gases. Furthermore, the cleaning gas may be diluted with an inert gas (e.g., nitrogen, argon and helium). A suitable cleaning gas is chosen, depending on the type and thickness of the deposit to be removed, the type of the material of the apparatus, and the like. In case that the cleaning gas is diluted, the hypofluorite concentration of the diluted cleaning gas is preferably at least 1 volume %, more preferably at least 5 volume %, still more preferably at least 10 volume %. If it is less than 1 volume %, the reaction rate may become too low.

In the invention, the cleaning conditions are not particularly limited. The temperature of the cleaning is preferably from 10 to 700° C., more preferably from 20 to 600° C. If it is higher than 700° C., the reactor may corrode too much. If it is lower than 10° C., the reaction rate of the cleaning may become too low. The pressure of the cleaning is not particularly limited. In fact, it is preferably from 0.1 to 760 Torr in plasma-less cleaning and preferably from 1 m Torr to 10 Torr in plasma-assisted cleaning In the invention, the etching manner and the reaction conditions of the etching, in which the etching gas of the invention is used, are not particularly limited. For example, the etching may be reactive ion etching (RIE) or electron cyclotron resonance (ECR) plasma-assisted etching. Due to the use of a hypofluorite for the etching gas, fluorine radicals reach the surface of a $SiO_2$ insulator film 2 that is to be partially removed by the etching gas (see FIG. 1). Furthermore, CFn ions impinge on the surface of the film 2. With this, the film 2 is etched away in a vertical direction, thereby to form, for example, a contact hole in the film 2, as shown in FIG. 2. The side walls of the contact hole are protected by the accumulation of a fluorocarbon polymer, thereby to achieve an anisotropic etching. In particular, a large amount of $CF_3^+$ ions are produced, as well as fluorine radicals, in plasma by the hypofluorite. Therefore, the etching gas of the invention is superior in etching efficiency. Furthermore, the etching gas of the invention contains oxygen of the hypofluorite. With this, a fluorocarbon film accumulated on the side walls of the contact hole can efficiently be removed, thereby to conduct an anisotropic etching.

In the invention, the etching can be conducted under various dry etching conditions, for example, of plasma etching, reactive plasma etching, and microwave etching. The etching gas of the invention may be prepared by mixing a hypofluorite with an inert gas (e.g., He, $N_2$ and Ar) and/or at least one other gas selected from, for example, HI, HBr, HCl, CO, NO, $O_2$, $CH_4$, $NH_3$, $H_2$, $C_2H_2$, and $C_2H_6$. In fact, it is preferable to add, to the hypofluorite, at least one first gas component selected from hydrogen and hydrogen-containing gases (e.g., $CH_4$, $NH_3$, HI, HBr, $C_2H_2$, and HCl), in the preparation of the etching gas, for the purposes of (1) reducing the amount of fluorine radicals, which accelerate isotropic etching, and (2) increasing the reaction selectivity toward $SiO_2$ over Si. Furthermore, the flow rate ratio of the at least one first gas component to the hypofluorite is preferably not greater than 10:1. If this ratio is greater than 10:1, the amount of fluorine radicals, which are useful for the etching, may become too low. It is preferable to add, to the hypofluorite, at least one second gas component selected from oxygen and oxygen-containing gases (e.g., CO, NO, $N_2O$, and $NO_2$), in the preparation of the etching gas, for the purpose of increasing the etching rate of metals over oxides and nitrides. It is particularly preferable that the flow rate ratio of the at least one second gas component to the hypofluorite is not greater than 4:1. If this ratio is greater than 4:1, the amount of fluorine radicals, which are useful for the etching, may become too low.

In the invention, the gas pressure of the etching is preferably not higher than 5 Torr, in order to conduct anisotropic etching. If the gas pressure is lower than 0.001 Torr, the etching rate may become too slow. The flow rate of the etching gas may vary, depending on the reactor capacity of the etching apparatus and the size of wafer, and is preferably from 10 to 10,000 standard cubic centimeters per minute (SCCM). The etching is conducted at a temperature preferably not higher than 400° C. If this temperature is greater than 400° C., the etching may proceed isotropically. This lowers the etching precision, and the resist may be etched away too much. If the etching gas comprises the above-mentioned at least one first and/or second gas component, it becomes possible, for example, to increase the etching rate selectivity toward the silicon oxide film over the silicon film in the preparation of the contact hole.

The following nonlimitative Examples are illustrative of the present invention.

EXAMPLES 1–4

In each of these examples, a test piece was prepared at first by thermally oxidizing the surface of a silicon wafer and then by forming a polycrystalline silicon film having a thickness of 200 μm through a thermal decomposition of $SiH_4$. This test piece was put on the lower electrode of a plasma CVD apparatus. Then, the test piece was subjected to an etching for 30 seconds by applying a high frequency or RF (radio frequency) power to the lower electrode and by feeding an etching gas, shown in Table 1, having a pressure of 0.5 Torr, a flow rate of 100 SCCM and a temperature of 20° C. In this etching, the frequency of the high frequency power source was 13.56 MHz, the power applied to the lower electrode was 0.2 W/cm², and the distance between the lower and upper electrodes was 10 mm. The result (etching rate) of the etching is shown in Table 1.

TABLE 1

|  | Etching Gas | Etching Rate (Å/min) |
| --- | --- | --- |
| Example 1 | $CF_3OF$ | 8,105 |
| Example 2 | $CF_3CF_2OF$ | 7,769 |
| Example 3 | $(CF_3)_3COF$ | 9,606 |
| Example 4 | $CF_2(OF)_2$ | 20,832 |

EXAMPLES 5–44 & COMPARATIVE EXAMPLE 1

In these examples and comparative example, Examples 1–4 were repeated except in that the etching gas types were changed as shown in Table 2, that the etching gas pressure was 10 Torr in place of 0.5 Torr, that the gas temperature was changed as shown in Table 2, and that the application of a high frequency power was omitted. The results (etching rates) are shown in Table 2.

TABLE 2

|  | Temp. (° C.) | Etching Gas | Etching Rate (Å/min) |
| --- | --- | --- | --- |
| Example 5 | 20 | $CF_3OF$ | 1,040 |
| Example 6 |  | $CF_2(OF)_2$ | 1,953 |
| Example 7 |  | $CF_3CF_2OF$ | 990 |
| Example 8 |  | $(CF_3)_3COF$ | 960 |
| Example 9 |  | $CF_2HCF_2OF$ | 780 |
| Example 10 |  | $(CF_3CF_2)(CF_3)_2COF$ | 970 |
| Example 11 |  | $CF_3OF$ | 480 |
| Example 12 |  | $CFH_2OF$ | 660 |
| Example 13 |  | $CF_2HOF$ | 770 |
| Example 14 |  | $CF_3CF_2CF_2OF$ | 910 |
| Example 15 |  | $(CF_3)_2CFOF$ | 930 |
| Example 16 | 100 | $CF_3OF$ | 3,230 |
| Example 17 |  | $CF_2(OF)_2$ | 4,385 |
| Example 18 |  | $CF_3CF_2OF$ | 2,780 |
| Example 19 | 200 | $CF_3OF$ | 9,810 |
| Example 20 |  | $CF_2(OF)_2$ | 10,259 |
| Example 21 |  | $CF_3CF_2OF$ | 6,620 |
| Example 22 | 300 | $CF_3OF$ | 20,500 |
| Example 23 |  | $CF_3(OF)_2$ | 49,853 |
| Example 24 |  | $CF_3CF_2OF$ | 9,880 |
| Example 25 | 400 | $CF_3OF$ | 32,900 |
| Example 26 |  | $CF_2(OF)_2$ | 59,560 |
| Example 27 |  | $CF_3CF_2OF$ | 14,700 |
| Com. Ex. 1 |  | $CF_4$ | 0 |
| Example 28 | 500 | $CF_3OF$ | 53,600 |
| Example 29 |  | $CF_2(OF)_2$ | 71,265 |
| Example 30 |  | $CF_3CF_2OF$ | 23,000 |
| Example 31 | 600 | $CF_3OF$ | 78,800 |
| Example 32 |  | $CF_2(OF)_2$ | 98,654 |
| Example 33 |  | $CF_3CF_2OF$ | 37,100 |
| Example 34 | 700 | $CF_3OF$ | 99,600 |
| Example 35 |  | $CF_2(OF)_2$ | 115,893 |
| Example 36 |  | $CF_3CF_2OF$ | 45,200 |
| Example 37 |  | $(CF_3)_3COF$ | 37,000 |
| Example 38 |  | $CF_2HCF_2OF$ | 31,000 |
| Example 39 |  | $(CF_3CF_2)(CF_3)_2COF$ | 34,500 |

TABLE 2-continued

| | Temp. (° C.) | Etching Gas | Etching Rate (Å/min) |
|---|---|---|---|
| Example 40 | | $CF_3OF$ | 25,000 |
| Example 41 | | $CFH_2OF$ | 31,500 |
| Example 42 | | $CF_2HOF$ | 33,000 |
| Example 43 | | $CF_3CF_2CF_2OF$ | 36,000 |
| Example 44 | | $(CF_3)_2CFOF$ | 35,200 |

EXAMPLE 45

In this example, a plasma CVD was conducted by using tetraethylsilicate (TEOS) and oxygen as raw materials, in an apparatus for conducing the plasma CVD. With this, $SiO_2$ having a thickness of about 0.05 to about 20 $\mu$m deposited on the wall of the apparatus. The inside of the apparatus was cleaned at 20° C. for 20 min by feeding cleaning gases of $CF_3OF$, $CF_2(OF)_2$ and $CF_3CF_2OF$ by turns and by applying a high frequency power to the lower electrode of the apparatus. Each cleaning gas had a pressure of 1 Torr and a flow rate of 100 SCCM. In this etching, the frequency of the high frequency power source was 13.56 MHz, the power applied to the lower electrode was 0.2 W/cm², and the distance between the lower and upper electrodes was 50 mm. It was found by an observation of the inside of the apparatus that the $SiO_2$ was completely removed by the cleaning with each cleaning gas.

EXAMPLE 46

A tungsten film was formed by a thermal CVD in a cold wall type apparatus for conducting the CVD. Then, it was found that the temperature in the vicinity of a heater disposed in the reactor was 500° C., that the temperature of a gas diffusion plate was 40° C., and that the temperature of the reactor wall was from 20 to 300° C. Furthermore, it was found that unnecessary tungsten films deposited in many positions in the apparatus. The thickest tungsten film deposited therein had a thickness of about 120 $\mu$m. It was further found that a tungsten oxide powder deposited in the piping of the apparatus. After the formation of the tungsten film, a first cleaning was conducted by allowing a cleaning gas of $CF_3OF$ to flow through the apparatus at a flow rate of 1 standard liter per minute (SLM) for 30 minutes. Then, it was found by an observation of the inside of the apparatus that the tungsten film of the inside of the reactor and the tungsten oxide powder of the piping were completely removed by the first cleaning. Then, a tungsten film was formed again in the same manner as above in the apparatus. After that, a second cleaning was conducted in the same manner as that of the first cleaning except in that $CF_3OF$ was replaced with $CF_3CF_2OF$. Then, a tungsten film was formed again in the same manner as above in the apparatus. After that, a third cleaning was conducted in the same manner as that of the first cleaning except in that $CF_3OF$ was replaced with $(CF_3)_3COF$. Similar to the above, it was found by an observation of the inside of the apparatus that the tungsten film of the inside of the reactor and the tungsten oxide powder of the piping were completely removed by the second and third cleanings.

EXAMPLE 47

At first, four test pieces were prepared by a thermal CVD by respectively forming a tungsten (W) film, a WSi film, a TiC film and a $Ta_2O_5$ film on four nickel substrates each having a length of 10 mm and a width of 20 mm and a thickness of 2 mm. Each film had a thickness of 50 $\mu$m. Then, these four test pieces were put on the lower electrode of a plasma CVD apparatus. Then, an etching was conducted for 10 min at 20° C. by allowing an etching gas of $CF_3OF$ to flow through the apparatus and by applying a high frequency power to the lower electrode. This etching gas had a pressure of 0.5 Torr and a flow rate of 100 SCCM. In this etching, the frequency of the high frequency power source was 13.56 MHz, the power applied to the lower electrode was 0.2 W/cm², and the distance between the lower and upper electrodes was 50 mm. After the etching, the test pieces were taken out of the CVD apparatus and then analyzed with an X-ray microanalyzer. With this, the peaks of W, Si, Ti and Ta were not found.

EXAMPLE 48

In this example, Example 47 was repeated except in that a Mo film, a Re film and an Nb film, each having a thickness of 50 $\mu$m, were respectively formed on three nickel substrates each having the same dimensions as those of Example 47 and that the etching was conducted for 3 min. The peaks of Mo, Re and Nb were not found by an analysis with X-ray microanalyzer.

EXAMPLE 49

In this example, Example 47 was repeated except in that a TiN film and a Ti film, each having a thickness of 5 $\mu$m, were respectively formed by sputtering on two nickel substrates each having the same dimensions as those of Example 47. The peak of Ti was not found by an analysis with X-ray microanalyzer.

EXAMPLE 50

In this example, Example 47 was repeated except in that an Au film, an Ag film and a Cr film, each having a thickness of 2 $\mu$m, were respectively formed by vacuum deposition on three nickel substrates each having the same dimensions as those of Example 47, that the etching gas flow rate was 10 SCCM, and that the power applied to the lower electrode was 0.315 W/cm². The peaks of Au, Ag and Cr were not found by an analysis with X-ray microanalyzer.

EXAMPLE 51

At first, a nickel vessel was charged with commercial phosphorus (white phosphorus), Ta, As, Ge, Se and B powders, each being in an amount of 5 mg. Then, the nickel vessel was put on the lower electrode of a plasma CVD apparatus. Then, an etching was conducted for 10 min at 20° C. by allowing an etching gas of $CF_3OF$ to flow through the apparatus and by applying a high frequency power to the lower electrode. This etching gas had a pressure of 1 Torr and a flow rate of 10 SCCM. In this etching, the frequency of the high frequency power source was 13.56 MHz, the power applied to the lower electrode was 0.315 W/cm², and the distance between the lower and upper electrodes was 50 mm. After the etching, it was found by an observation of the vessel and the inside of the apparatus that all the powders were completely removed.

EXAMPLES 52–64

In each of these examples, a silicon film was formed by using $SiH_4$ as a raw material in an apparatus. After that, there were found in the apparatus silicon and polysilane powders, which were deposited in a reactor of the apparatus, and a polysilane powder, which was deposited in the piping of the apparatus. This piping is outside of the plasma region. Then, a plasma-assisted cleaning was conducted a certain times as shown in Table 3 for 30 min per one time of the cleaning for the purpose of removing these powders of the apparatus. In this cleaning, a cleaning gas of $CF_3OF$ was allowed to flow through the apparatus at a flow rate of 1 SLM under a pressure of 1 Torr. Furthermore, oxygen and nitrogen were selectively allowed to flow therethrough, as shown in Table 3. During the cleaning, the temperature of the inside of the piping was 20° C., and that of the inside of the reactor was from 40 to 400° C. After the cleaning, the inside of the apparatus was observed, and the result of this observation is shown in Table 3. In Table 3, ○ means that the powders were completely removed from the inside of the reactor and the piping, and the deposition of an organic fluoride did not occur; Δ means that the powders were completely removed from the inside of the reactor and the piping, but the deposition of an organic fluoride in the form of powder or film was found at an end portion (particularly a low temperature portion) of the piping; and □ means that a silicon oxide formed by oxidation of the polysilane powder deposited. In each of Examples 52–64, at least the inside of the reactor was cleaned.

TABLE 3

| | $O_2$ Flow Rate (SCCM) | $N_2$ Flow Rate (SCCM) | The Number of Cleanings (time(s)) | Observation Result after Cleaning |
|---|---|---|---|---|
| Example 52 | 0 | 0 | 1 | ○ |
| Example 53 | 0 | 0 | 2 | ○ |
| Example 54 | 0 | 0 | 3 | Δ |
| Example 55 | 1 | 0 | 3 | Δ |
| Example 56 | 3 | 0 | 3 | Δ |
| Example 57 | 4 | 0 | 3 | ○ |
| Example 58 | 4 | 0 | 10 | Δ |
| Example 59 | 100 | 0 | 10 | ○ |
| Example 60 | 500 | 0 | 10 | ○ |
| Example 61 | 50 | 50 | 10 | ○ |
| Example 62 | 5,000 | 0 | 10 | ○ |
| Example 63 | 8,000 | 0 | 10 | ○ |
| Example 64 | 9,000 | 0 | 10 | Δ |

EXAMPLES 65–70

In each of these examples, a silicon film was formed in an apparatus by using $SiH_4$ as a raw material. After that, there were found in the apparatus silicon and polysilane powders, which were deposited in a reactor of the apparatus, and a polysilane powder, which was deposited in a piping of the apparatus. This piping was outside of the plasma region. Then, a plasma-assisted cleaning was repeatedly conducted for 30 min per one time of the cleaning for the purpose of removing these powders of the apparatus. In this cleaning, a cleaning gas of $CF_3OF$ was allowed to flow through the apparatus at a flow rate of 1 SLM under a pressure of 1 Torr. Furthermore, an oxygen-containing gas shown in Table 4 was allowed to flow therethrough, together with $CF_3OF$. During the cleaning, the temperature of the inside of the piping was 20° C., and that of the inside of the reactor was from 40 to 400° C. After the cleaning, the inside of the apparatus was observed, and the result of this observation is shown in Table 4. In Table 4, ○ means the same as that of Table 3 of Examples 52–64.

TABLE 4

| | Oxygen-containing Compound | Flow Rate of Oxygen-containing Compound (SCCM) | Observation Result after Cleaning |
|---|---|---|---|
| Example 65 | $CO_2$ | 20 | ○ |
| Example 66 | CO | 50 | ○ |
| Example 67 | NO | 20 | ○ |
| Example 68 | NO | 100 | ○ |
| Example 69 | $NO_2$ | 5 | ○ |
| Example 70 | $N_2O$ | 10 | ○ |

EXAMPLE 71

A thermal CVD was conducted in an apparatus such that a tungsten film having a thickness from 10 to 20 μm was deposited on the wall of a reactor of this apparatus. Separately, a mechanism for exciting a gas with microwave was attached with the reactor via a piping. Then, a remote plasma-assisted cleaning of the apparatus was conducted for 10 min using microwave plasma. In this cleaning, a cleaning gas of $CF_3OF$ was allowed to flow at a flow rate of 1,000 SCCM under a pressure of 0.1 Torr. The microwave output was 50W (13.56 MHz), and the substrate temperature was 18° C. After the cleaning, it was found that the inside of the reactor was completely cleaned and that a powder (i.e., a mixture of tungsten and tungsten oxide) deposited in the piping was completely removed.

EXAMPLE 72

In this example, Example 71 was repeated except in that $CF_2(OF)_2$ was used as the cleaning gas. After the cleaning, it was found that the inside of the reactor was completely cleaned and that a powder (i.e., a mixture of tungsten and tungsten oxide) deposited in the piping was completely removed.

EXAMPLES 73–75 & COMPARATIVE EXAMPLE 2

Figure 2:
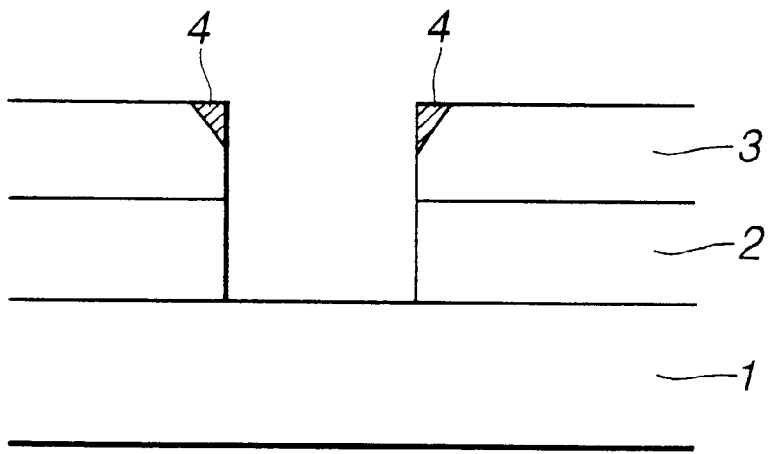
FIG. 2 is a view similar to FIG. 1, but showing the multilayer structure after the etching.

In each of these examples and comparative example, as shown in FIG. 1, a multilayer structure was prepared by forming a $SiO_2$ insulator film 2 and a resist mask 3 on a single crystal silicon wafer 1. Then, an opening was formed in the resist mask, as illustrated in FIG. 1. After that, the multilayer structure shown in FIG. 1 was put into an etching apparatus equipped with a power source for supplying a high frequency power of 13.56 MHz. Then, an etching of an exposed portion of the insulator film 2 was conducted for the purpose of making a contact hole in the insulator film 2, as shown in FIG. 2. In the etching, an etching gas shown in Table 5 was allowed to flow through the apparatus at a flow rate of 50 SCCM under a pressure of 0.02 Torr with a RF (radio frequency) power density of 2.2 W/cm². After the etching, the etching rate of this etching, the selectivity of the etching toward the insulator film 2 over the resist 3, and the aspect ratio were determined, and their results are shown in Table 5. Furthermore, the loss of shoulder portions 4 of the resist 3 (see FIG. 2) was checked, and its result is also shown in Table 5.

TABLE 5

|  | Etching Gas | Etching Rate (Å/min) | Selectivity | Aspect Ratio | Loss of Shoulder Portions |
|---|---|---|---|---|---|
| Example 73 | $CF_3OF$ | 5,453 | 6 | At least 7 | No |
| Example 74 | $C_2F_5OF$ | 4,026 | 7 | At least 7 | No |
| Example 75 | $CF_2(OF)_2$ | 7,563 | 6 | At least 6 | No |
| Com. Ex. 2 | $CF_4$ | 608 | 4 | 5 | Yes |

EXAMPLE 76

In this example, Example 73 was repeated except in that an argon gas with a flow rate of 200 SCCM was added to the etching gas ($CF_3OF$) of Example 73 and that the flow rate of $CF_3OF$ was 10 SCCM.

EXAMPLES 77–84

In each of these examples, Example 73 was repeated except in that a hydrogen-containing gas with a flow rate shown in Table 6 was added to the etching gas ($CF_3OF$) of Example 73 and the flow rate of $CF_3OF$ was changed as shown in Table 6. In fact, the total flow rate of $CF_3OF$ and the hydrogen-containing gas was adjusted to 100 SCCM in Examples 77–84, as shown in Table 6. The results of the etching rates of the insulator film 2, which is made of $SiO_2$, and the silicon wafer 1, which is made of Si, are shown in Table 6. It is understood from Table 6 that the etching rate of the silicon wafer 1 has decreased drastically with the increase of the flow rate of the hydrogen-containing gas, and in contrast the etching rate of the $SiO_2$ insulator film was relatively stable even with the increase of the flow rate of the hydrogen-containing gas. In other words, it is understood that the $SiO_2$ insulator film can selectively be etched away by adding a hydrogen-containing gas into the etching gas (i.e., hypofluorite), over the silicon wafer. Furthermore, similar results of the etching rates were also obtained by respectively using $CH_4$, HI, HCl and HBr as hydrogen-containing gases.

TABLE 6

|  | Flow Rate of $CF_3OF$ (SCCM) | Hydrogen-containing Gas | Flow Rate of Hydrogen-containing Gas (SCCM) | Etching Rate (Å/min) Insulator Film | Etching Rate (Å/min) Silicon Wafer |
|---|---|---|---|---|---|
| Example 77 | 100 | $H_2$ | 0 | 5,560 | 40,856 |
| Example 78 | 99.9 | $H_2$ | 0.1 | 5,560 | 38,856 |
| Example 79 | 99 | $H_2$ | 1 | 5,560 | 18,856 |
| Example 80 | 90 | $H_2$ | 10 | 5,260 | 5,189 |
| Example 81 | 70 | $H_2$ | 30 | 5,240 | 889 |
| Example 82 | 60 | $H_2$ | 40 | 5,060 | 11 |
| Example 83 | 10 | $H_2$ | 90 | 3,596 | 0.5 |
| Example 84 | 60 | $C_2H_2$ | 40 | 5,010 | 9 |

EXAMPLE 85

In this example, a first etching was conducted by etching a tungsten film in the same way as that of Example 73. The etching rate of the first etching was 39,554 Å/min. A second etching was conducted in the same way as that of the first etching except in that oxygen with a flow rate of 10 SCCM was added to the etching gas ($CF_3OF$). The etching rate of the second etching was 400,259 Å/min. A third etching was conducted in the same way as that of the first etching except in that the tungsten film was replaced with a $SiO_2$ film. The etching rate of the third etching was 5,453 Å/min. A fourth etching was conducted in the same way as that of the third etching except in that oxygen with a flow rate of 10 SCCM was added to the etching gas ($CF_3OF$). The etching rate of the fourth etching was 9,865 Å/min. It is understood from the etching rates of the first to fourth etchings that the etching rate of a metal film (tungsten film) increases more greatly by adding oxygen to an etching gas, than that of an oxide film ($SiO_2$) does.

The entire disclosure of each of Japanese Patent Application Nos. 9-349536 filed on Dec. 18, 1997, 10-239338 filed on Aug. 26, 1998, and 10-239339 filed on Aug. 26, 1998, including specification, claims, drawings and summary, is incorporated herein by reference in its entirety.

What is claimed is:

1. A gas for removing a deposit by a gas-solid reaction, said gas comprising:
   a hypofluorite; and
   at least one gas component selected from the group consisting of:
   (a) a first gas component selected from the group consisting of hydrogen, $CH_4$, $NH_3$, HI, HBr, $C_2H_2$ and HCl, and
   (b) a second gas component selected from the group consisting of oxygen, $CO_2$, CO NO, $NO_2$ and $N_2O$,
   wherein, when said gas contains said first gas component, a ratio by volume of said hypofluorite to said first gas component is at least 1:10,
   wherein, when said gas contains said second gas component, said second gas component is in an amount from 0.4 to 90 volume % based on a total volume of said second gas component and said hypofluorite.

2. A gas according to claim 1, wherein said hypofluorite optionally has at least one group selected from the group consisting of halogen atoms, ether groups, alcohol groups, carbonyl groups, carboxyl groups, ester groups, amine groups, and amide groups.

3. A gas according to claim 2, wherein said hypofluorite is selected from the group consisting of $CF_3OF$, $CF_2(OF)_2$, $CF_3CF_2OF$, $CH_3COOF$, $(CF_3)_3COF$, $CF_2HCF_2OF$, $(CF_3CF_2)(CF_3)_2COF$, $CH_3OF$, $CFH_2OF$, $CF_2HOF$, $CF_3CF_2CF_2OF$, and $(CF_3)_2CFOF$.

4. A gas according to claim 1, further comprising an inert gas.

5. A gas according to claim 1, wherein said deposit is selected from the group consisting of B, P, W, Si, Ti, V, Nb, Ta, Se, Te, Mo, Re, Os, Ru, Ir, Sb, Ge, Au, Ag, As and Cr, and oxides, nitrides, carbides and alloys of these elements.

6. A gas according to claim 1, wherein said gas is a cleaning gas for substantially completely removing said deposit, said cleaning gas comprising 1–99.6 volume % of said hypofluorite.

7. A gas according to claim 6, wherein said cleaning gas has a temperature from 10 to 700° C.

8. A gas according to claim 6, wherein said cleaning gas has a first pressure from 0.1 to 760 Torr, when said cleaning gas is used in a plasma-less cleaning, or a second pressure from 1 m Torr to 10 Torr, when said cleaning gas is used in a plasma-assisted cleaning.

9. A gas according to claim 1, wherein said gas is an etching gas for removing a portion of said deposit, and wherein said second gas component of said etching gas is selected from the group consisting of CO, NO, $N_2O$, and $NO_2$.

10. A gas according to claim 1, wherein said gas is an etching gas for removing a portion of said deposit, and wherein a volume ratio of said hypofluorite to said second gas component in said etching gas is at least 1:4.

11. A gas according to claim 1, wherein said gas is an etching gas for removing a portion of said deposit, and wherein said etching gas has a pressure from 0.001 Torr to 5 Torr.

12. A gas according to claim 1, wherein said gas is an etching gas for removing a portion of said deposit, and wherein said etching gas has a temperature of not higher than 400° C.

13. A gas according to claim 1, wherein said first gas component is in an amount from 0.1 to 90 volume % based on a total volume of said first gas component and said hypofluorite.

14. A gas according to claim 1, wherein said deposit is a deposit accumulated in an apparatus for producing a semiconductor device.

15. A gas according to claim 1, wherein said deposit is a portion of a film deposited on a substrate for producing thin film devices.

* * * * *